(12) United States Patent
Ha et al.

(10) Patent No.: US 8,461,592 B2
(45) Date of Patent: Jun. 11, 2013

(54) ORGANIC LIGHT EMITTING DISPLAY DEVICE

(75) Inventors: Jae-Heung Ha, Yongin (KR);
Kyu-Hwan Hwang, Yongin (KR);
Young-Woo Song, Yongin (KR);
Seok-Gyu Yoon, Yongin (KR);
Jong-Hyuk Lee, Yongin (KR);
Yoon-Hyeung Cho, Yongin (KR)

(73) Assignee: Samsung Display Co., Ltd.,
Giheung-Gu, Yongin, Gyeonggi-Do (KR)

( * ) Notice: Subject to any disclaimer, the term of this patent is extended or adjusted under 35 U.S.C. 154(b) by 81 days.

(21) Appl. No.: 13/015,268

(22) Filed: Jan. 27, 2011

(65) Prior Publication Data

US 2011/0186846 A1 Aug. 4, 2011

(30) Foreign Application Priority Data

Feb. 3, 2010 (KR) .......................... 10-2010-0010130

(51) Int. Cl.
*H01L 51/52* (2006.01)

(52) U.S. Cl.
USPC ..................................... 257/59; 257/E51.018

(58) Field of Classification Search
USPC ....................................... 257/98, E51.018, 59
See application file for complete search history.

(56) References Cited

U.S. PATENT DOCUMENTS

| | | | |
|---|---|---|---|
| 7,294,962 B2 | 11/2007 | Kim et al. | |
| 7,397,179 B2 | 7/2008 | Kim | |
| 7,453,198 B2 | 11/2008 | Kang et al. | |
| 7,510,891 B2 | 3/2009 | Chun et al. | |
| 7,544,534 B2 | 6/2009 | Lee et al. | |
| 7,626,204 B2 | 12/2009 | Jeong et al. | |
| 7,687,983 B2 | 3/2010 | Lee et al. | |

(Continued)

FOREIGN PATENT DOCUMENTS

| | | |
|---|---|---|
| JP | 2001-230086 | 8/2001 |
| JP | 3902938 B2 | 4/2007 |

(Continued)

OTHER PUBLICATIONS

Korean Registration Determination Certificate issued by KIPO on Dec. 6, 2011, corresponding to KR 10-2010-0010130 and Request for Entry attached herewith.

*Primary Examiner* — Matthew Landau
*Assistant Examiner* — Edward Chin
(74) *Attorney, Agent, or Firm* — Robert E. Bushnell, Esq.

(57) ABSTRACT

A transparent organic light emitting display device having improved transmittance comprises: a first substrate having a transmitting region and a plurality of pixel regions separated from each other by the transmitting region; thin film transistors positioned on a first surface of the first substrate and disposed in the pixel regions of the substrate; a passivation layer covering the thin film transistors; a plurality of pixel electrodes, formed on the passivation layer so as to be electrically connected to the thin film transistors, located in the pixel regions, and overlapping and covering the thin film transistors; an opposite electrode facing the pixel electrodes, formed to be able to transmit light, and located in the transmitting region and the pixel regions; an organic emission layer interposed between the pixel electrode and the opposite electrode to emit light; a second substrate facing the opposite electrode and bonded to the first substrate; and a conduction unit interposed between the second substrate and the opposite electrode, and having both ends contacting the second substrate and the opposite electrode.

20 Claims, 10 Drawing Sheets

U.S. PATENT DOCUMENTS

| | | |
|---|---|---|
| 7,692,197 B2 | 4/2010 | Park et al. |
| 7,700,954 B2 | 4/2010 | Noguchi et al. |
| 8,134,652 B2 * | 3/2012 | Rho et al. ................... 349/12 |
| 2002/0011783 A1 | 1/2002 | Hosokawa |
| 2002/0053401 A1 | 5/2002 | Ishikawa et al. |
| 2003/0052869 A1 | 3/2003 | Fujii et al. |
| 2005/0029936 A1 | 2/2005 | Kim |
| 2005/0082534 A1 | 4/2005 | Kim et al. |
| 2005/0110021 A1 | 5/2005 | Park et al. |
| 2005/0269945 A1 | 12/2005 | Su |
| 2005/0275339 A1 | 12/2005 | Seo et al. |
| 2005/0285100 A1 | 12/2005 | Jeong et al. |
| 2006/0060870 A1 | 3/2006 | Park et al. |
| 2006/0082292 A1 | 4/2006 | Kang et al. |
| 2006/0290634 A1 | 12/2006 | Hwang |
| 2007/0046186 A1 | 3/2007 | Kim |
| 2007/0176169 A1 | 8/2007 | Lee et al. |
| 2008/0049176 A1 * | 2/2008 | Kim et al. ................. 349/114 |
| 2008/0128686 A1 | 6/2008 | Kwon |
| 2008/0230775 A1 | 9/2008 | Rhee et al. |
| 2009/0058280 A1 | 3/2009 | Jo et al. |
| 2009/0128023 A1 | 5/2009 | Kwak et al. |
| 2009/0179560 A1 | 7/2009 | Chun et al. |
| 2009/0267074 A1 | 10/2009 | Kwon et al. |
| 2009/0280590 A1 | 11/2009 | Seo et al. |
| 2009/0315456 A1 * | 12/2009 | Furukawa et al. ............ 313/504 |
| 2010/0148192 A1 * | 6/2010 | Jung et al. .................. 257/88 |
| 2010/0264817 A1 * | 10/2010 | Bouten et al. ................ 313/512 |
| 2011/0175097 A1 * | 7/2011 | Song et al. .................. 257/59 |

FOREIGN PATENT DOCUMENTS

| | | |
|---|---|---|
| JP | 2008-204890 | 9/2008 |
| JP | 2008-293680 | 12/2008 |
| JP | 2009-230955 | 10/2009 |
| JP | 2009-231411 | 10/2009 |
| KR | 10-2004-0074658 A | 8/2004 |
| KR | 10-2005-0015365 A | 2/2005 |
| KR | 10-0553745 B1 | 2/2006 |
| KR | 10-0666648 B1 | 1/2007 |
| KR | 10-2007-0078599 A | 8/2007 |
| KR | 10-2008-0086025 A | 9/2008 |
| KR | 10-2009-0016238 A | 2/2009 |

* cited by examiner

FIG. 9C

ORGANIC LIGHT EMITTING DISPLAY DEVICE

CLAIM OF PRIORITY

This application makes reference to, incorporates the same herein, and claims all benefits accruing under 35 U.S.C. §119 from an application earlier filed in the Korean Intellectual Property Office on 3, Feb. 2010 and there duly assigned Serial No. 10-2010-0010130.

BACKGROUND OF THE INVENTION

1. Field of the Invention

The present invention relates to an organic light emitting display device and, more particularly, to a transparent organic light emitting display device.

2. Description of the Related Art

Applications of organic light emitting display devices range from personal portable devices, such as MP3 players and mobile phones, to television sets due to having superior characteristics, such as wide viewing angles, high contrast ratios, short response times, and low amounts of power consumption.

An organic light emitting display device has self-light emitting characteristics, and the weight and thickness of the organic light emitting display device can be reduced since the organic light emitting display device, unlike the liquid crystal display device, does not require an additional light source.

Also, an organic light emitting display device can be formed so as to be a transparent display device by having transparent thin film transistors and transparent organic light emitting devices.

In a transparent display device, when the device is in an off-state, an object or an image positioned on a side of the device opposite to the user is transmitted to the user not only through organic light emitting diodes but also through patterns of thin film transistors and various wires and through spaces between the patterns of thin film transistors and various wires. Even in the transparent display device, transmittances of the above-described organic light emitting diodes, the thin film transistors, and the wires are not so high, and spaces between the organic light emitting diodes, the thin film transistor, and the wires are very small, and thus the transmittance of the transparent display device is not high.

Also, a distorted image may be transmitted to the user due to the above-described patterns, i.e., the patterns of the organic light emitting diodes, the thin film transistors, and the wires. The reason for this is because gaps between the patterns are only a few nanometers, that is, at a level almost close to the wavelengths of visible light, and thus the gaps scatter light therethrough.

Furthermore, when an opposite electrode to be commonly deposited on the entire screen in order to improve transmittance of external light, voltage drop (i.e., IR drop) may occur in the opposite electrode, and in particular, as the size of an organic light emitting display device increases, voltage drop may occur remarkably.

SUMMARY OF THE INVENTION

The present invention provides a transparent organic light emitting display device having an improved transmittance, in which voltage drop in an opposite electrode can be reduced.

The present invention also provides a transparent organic light emitting display device which can prevent distortion of an image transmitted therethrough by preventing light transmitted therethrough from scattering.

According to an aspect of the present invention, an organic light emitting display device includes: a first substrate having a transmitting region and a plurality of pixel regions separated from each other by the transmitting region interposed between the pixel regions; a plurality of thin film transistors which are positioned on a first surface of the first substrate, and which are disposed in the pixel regions of the substrate, respectively; a passivation layer covering the plurality of thin film transistors; a plurality of pixel electrodes which are formed on the passivation layer so as to be electrically connected to the thin film transistors, respectively, which are located in the pixel regions, respectively, and which are disposed so as to overlap and cover the thin film transistors, respectively; an opposite electrode which faces the pixel electrodes, which is formed so as to be able to transmit light, and which is located in the transmitting region and the pixel regions; an organic emission layer which is interposed between the pixel electrode and the opposite electrode so as to emit light; a second substrate disposed so as to face the opposite electrode and bonded to the first substrate; and a conduction unit interposed between the second substrate and the opposite electrode, having both ends contacting the second substrate and the opposite electrode, respectively, and formed of a conductive material.

The pixel electrode may have an area identical to that of one of the pixel regions.

The organic light emitting display device may further include a plurality of conductive lines electrically connected to the thin film transistors, respectively, wherein all of the conductive lines are arranged to overlap the pixel electrodes, respectively.

A ratio of an area of the transmitting region with respect to a total area of the pixel regions and the transmitting region is, preferably, between 5% and 90%.

The passivation layer is, preferably, formed on both the transmitting region and the pixel regions and is, preferably, formed of a transparent material.

The conduction unit is, preferably, disposed so as to correspond to the transmitting region.

The organic light emitting display device preferably further includes: a sealant for sealing edges of the first and second substrates; and a filler interposed between the first and second substrates which are sealed by the sealant.

The conduction unit preferably includes an inlet portion, and the inlet portion does not contact the opposite electrode, and the filler is interposed between the inlet portion and the opposite electrode.

The conduction unit is, preferably, formed on a surface of the second substrate in a direction toward the opposite electrode.

The pixel electrode is, preferably, a reflection electrode.

According to another asepct of the present invention, an organic light emitting display device includes: a first substrate having a transmitting region and a plurality of pixel regions separated from each other by the transmitting region interposed between the pixel regions; a plurality of pixel circuit units formed on a first surface of the first substrate, each including at least one thin film transistor, and each positioned in the pixel regions, respectively; a first insulating layer covering the pixel circuit units; a plurality of pixel electrodes formed on the first insulating layer so as to be electrically connected to the pixel circuit units, respectively, and disposed so as to overlap and cover the pixel circuit units, respectively; an opposite electrode which faces the pixel electrodes, is formed so as to be able to transmit light, and is located in the transmitting region and the pixel regions; an organic emission layer interposed between the pixel electrode and the opposite electrode so as to emit light; a second substrate disposed so as to face the opposite electrode and bonded to the first substrate; and a conduction unit interposed between the second substrate and the opposite electrode, having both ends contacting the second substrate and the opposite electrode, respectively, and formed of a conductive material.

The pixel electrode preferably has an area identical to that of one of the pixel regions.

The organic light emitting display device preferably further includes a plurality of conductive lines electrically connected to the pixel circuit units, respectively, wherein all of the conductive lines are arranged so as to cross the pixel regions, respectively.

A ratio of an area of the transmitting region with respect to a total area of the pixel regions and the transmitting region is, preferably, between 5% and 90%.

The first insulating layer and a plurality of second insulating layers are preferably formed on both the transmitting region and the pixel regions, and formed of a transparent material.

The conduction unit is, preferably, disposed so as to correspond to the transmitting region.

The organic light emitting display device preferably further includes: a sealant for sealing edges of the first and second substrates; and a filler interposed between the first and second substrates which are sealed by the sealant.

The conduction unit preferably includes an inlet portion, the inlet portion does not contact the opposite electrode, and the filler is, preferably, interposed between the inlet portion and the opposite electrode.

The conduction unit is, preferably, formed on a surface of the second substrate in a direction toward the opposite electrode.

The pixel electrode is, preferably, a reflection electrode.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings, in which like reference symbols indicate the same or similar components, wherein.

DETAILED DESCRIPTION OF THE INVENTION

The present invention will now be described more fully with reference to the accompanying drawings in which exemplary embodiments of the invention are shown.

Figure 1:
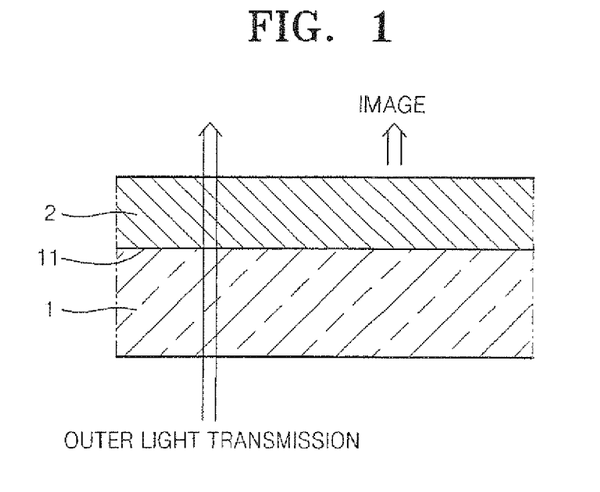
FIG. 1 is a cross-sectional view of an organic light emitting display device according to an embodiment of the present invention.

FIG. 1 is a cross-sectional view of an organic light emitting display device according to an embodiment of the present invention.

Referring to FIG. 1, the organic light emitting display device according to an embodiment of the present invention includes a display unit 2 formed on a first surface 11 of a first substrate 1.

In the organic light emitting display device, external light enters through the first substrate 1 and the display unit 2.

As will be described later, the display unit 2 is formed so as to be able to transmit external light. That is, referring to FIG. 1, the display unit 2 is formed in such a way that a user positioned on a side where an image is displayed can observe an external image formed through the first substrate 1.

Figure 2:
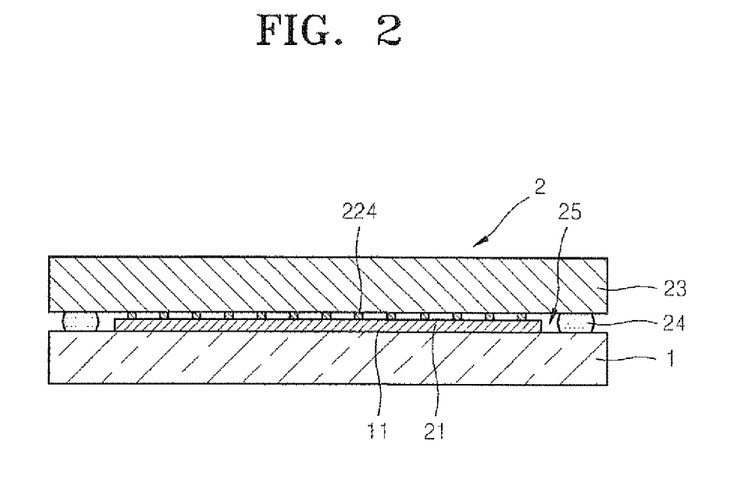
FIG. 2 is an enlarged cross-sectional view showing the organic light emitting display device of FIG. 1.

FIG. 2 is a cross-sectional view specifically showing an embodiment of the organic light emitting display device of FIG. 1. The display unit 2 includes an organic light emitting unit 21 formed on the first surface 11 of the first substrate 1 and a second substrate 23 to seal the organic light emitting unit 21.

The second substrate 23 may be formed of a transparent material so as to allow viewing of an image generated by the organic light emitting unit 21 and to prevent external air and moisture from penetrating into the organic light emitting unit 21.

Edges of the first substrate 1 and the second substrate 23 are sealed by a sealant 24, and thus a space 25 is formed between the first substrate 1 and the second substrate 23. As will be described later, the space 25 may be filled with a filler, and a conduction unit 224 is positioned in the space 25.

Figure 3:
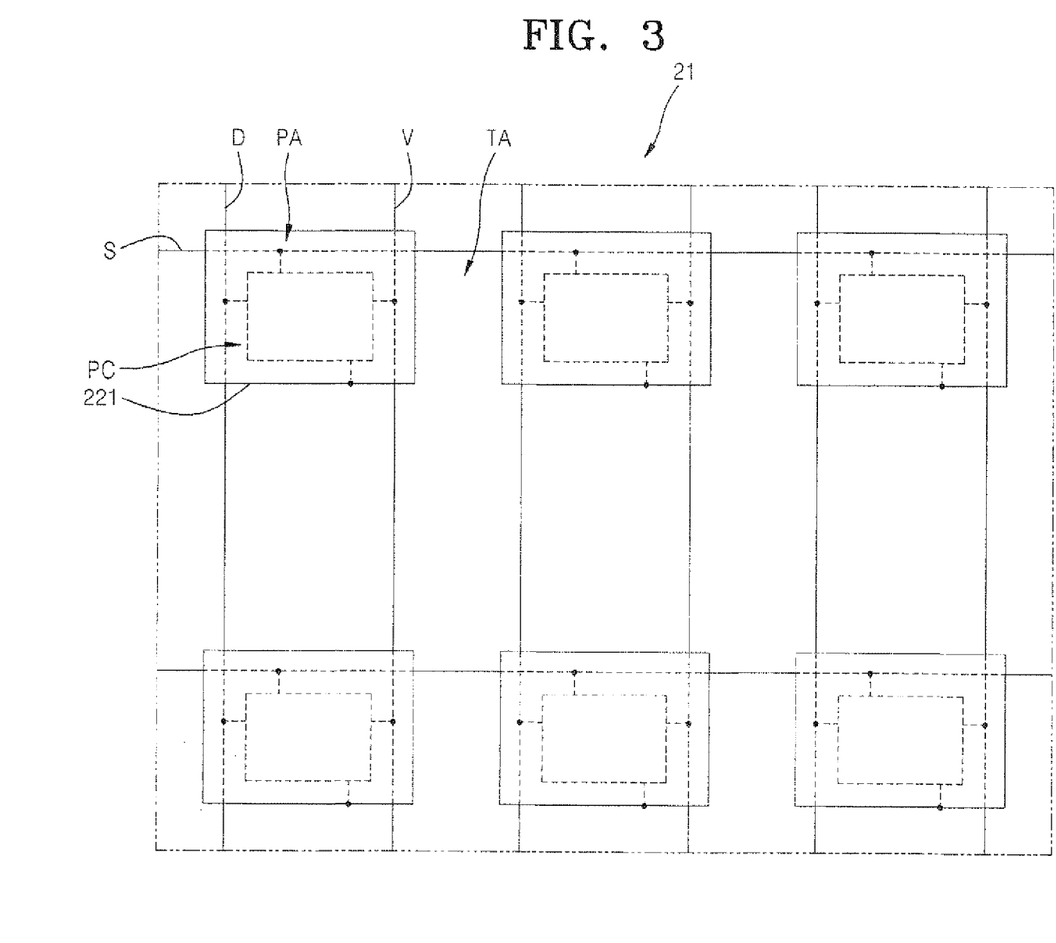
FIG. 3 is a schematic drawing showing an organic light emitting unit of the organic light emitting display device of FIG. 1.
Figure 4:
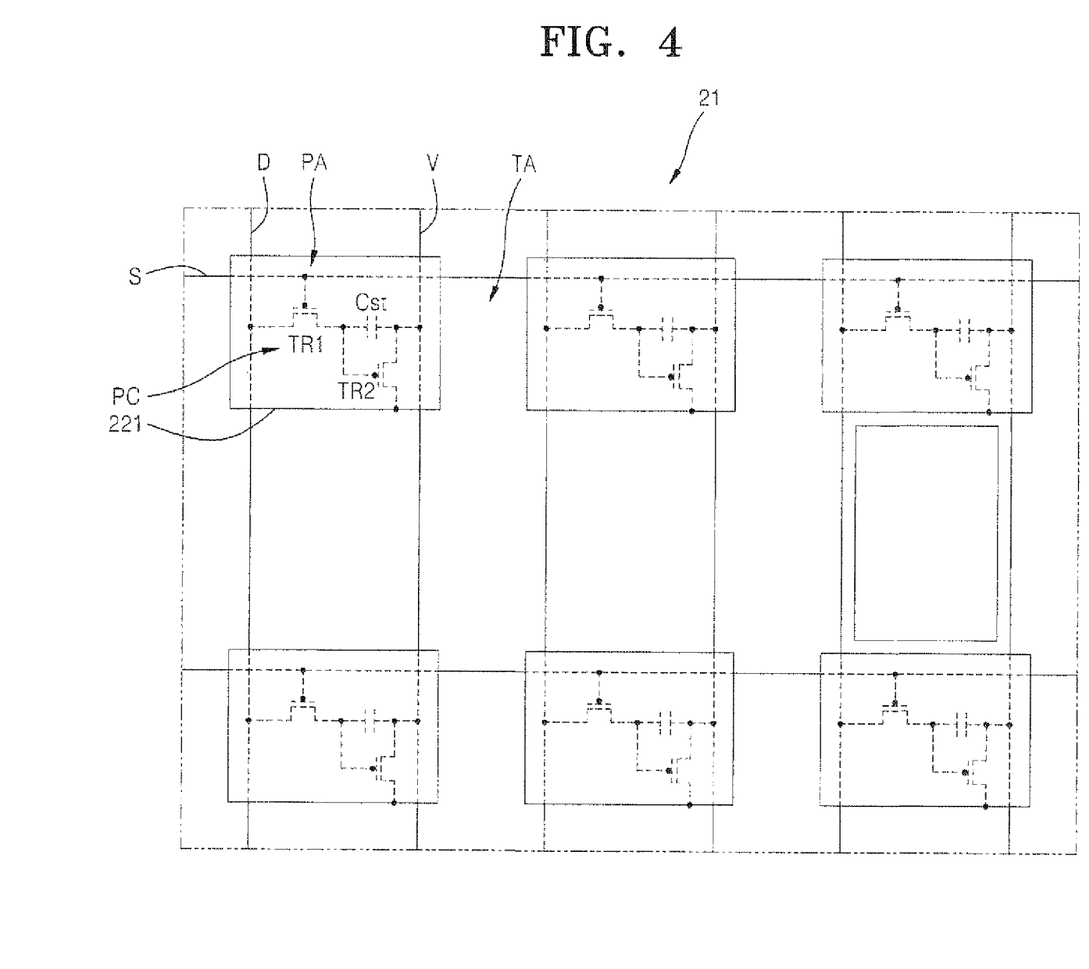
FIG. 4 is a schematic drawing showing details of an example of the organic light emitting unit of FIG. 3.

FIG. 3 is a schematic drawing showing an example of the organic light emitting unit 21 of FIG. 2, and FIG. 4 is a schematic drawing of the organic light emitting unit 21, including an example of a pixel circuit unit PC. Referring to FIGS. 2 thru 4, according to an embodiment of the present invention, the organic light emitting unit 21 is formed on the first substrate 1, and transmitting regions TA for transmitting external light and a plurality of pixel regions PA, separated from each other and having the transmitting regions TA interposed therebetween, are defined on organic light emitting unit 21.

Each of the pixel regions PA includes the pixel circuit unit PC, and a plurality of conductive lines, such as a scan line S, a data line D and a driving power line V, are electrically connected to the pixel circuit unit PC. Although not shown, various other conductive lines, besides the scan line S, the data line D, and the driving power line V, may be connected to the pixel circuit unit PC according to the configuration of the pixel circuit unit PC.

As shown in FIG. 4, the pixel circuit unit PC includes a first thin film transistor TR1 connected to the scan line S and the data line D, a second thin film transistor TR2 connected to the first thin film transistor TR1 and the driving power line V, and a capacitor Cst connected to the first and second thin film transistors TR1 and TR2. The first thin film transistor TR1 is a switching transistor and the second thin film transistor TR2 is a driving transistor. The second thin film transistor TR2 is electrically connected to a pixel electrode 221. In FIG. 4, the first and second thin film transistors TR1 and TR2, respectively, are P-type transistors, but are not limited thereto, and at least one of the first and second thin film transistors TR1 and TR2, respectively, may be an N-type transistor. The number of thin film transistors and the number of capacitors are not limited to the examples of FIGS. 3 and 4 and, for example, two or more thin film transistors and one or more capacitors may be combined with each other depending on the pixel circuit unit PC.

According to an embodiment of the present invention, all of the conductive lines, including the scan line S, the data line D and the driving power line V, are disposed so as to cross the pixel region PA.

The pixel regions PA are light emitting regions. Since the pixel circuit unit PC is located in the light emitting regions and all of the conductive lines, including the scan line S, the data line D and the driving power line V, cross the light emitting regions, the user can see an outside view through the transmitting regions TA. As will be described later, since a portion of each of the scan line S, the data line D, and the driving power line V transmits the transmitting regions TA, the area of a conductive pattern, which is one of main factors causing lowering of the transmittance of the transparent organic light emitting display device, is minimized. Thus, the transmittance of the transmitting regions TA is further increased. In this way, a region wherein the image is displayed is divided into the pixel regions PA and the transmitting regions TA, and a major portion of the conductive patterns, which is one of main factors causing lowering of the overall transmittance of the transparent organic light emitting display device, is disposed in the pixel regions PA so as to increase the transmittance of the transmitting regions TA so that the transmittance of the region, wherein the image is displayed, of the organic light emitting display device can be improved, as compared to the transmittance of a conventional transparent display device.

In addition, external image distortion, which occurs when the user observes the outside view through the transmitting regions TA according to the region where the image is displayed, which is divided into the pixel regions PA and the transmitting regions TA, as described above, due to scattering of external light caused by interfering with the patterns of internal devices of the pixel circuit unit PC, can be prevented.

Although the conductive lines, including scan line S, data line D and driving power line V, are disposed so as to cross the transmitting region TA between the pixel regions PA, since the conductive lines are formed so as to be very thin, the conductive lines can hardly be observed by the user and have little effect on the overall transmittance of the organic light emitting unit 21, and accordingly, a transparent display can be realized. Also, although the user may not see the external image as much in regions covered by the pixel regions PA, in consideration of the overall display region, there is little effect on observing the external image since the pixel regions PA are like a plurality of dots regularly arranged on a surface of a transparent glass.

The transmitting regions TA and the pixel regions PA are formed in such a way that a ratio of the area of the transmitting regions TA with respect to the overall area of the transmitting regions TA and the pixel regions PA is between 5% and 90%.

If the ratio of the area of the transmitting regions TA with respect to the overall area of the transmitting regions TA and the pixel regions PA is less than 5%, with respect to FIG. 1, the user can hardly see an object or image on a side opposite to the user due to lack of light which can transmit through the display unit 2 when the display unit 2 is in an off-state. That is, it cannot be said that the display unit 2 is transparent. Although the ratio of the area of the transmitting regions TA with respect to the overall area of the transmitting regions TA and the pixel regions PA may be approximately 5%, the pixel regions PA are present in an island state with respect to the transmitting regions TA, and scattering of solar light is minimized since all conductive patterns are disposed across the pixel regions PA, and thus, the display unit 2 may be recognized as a transparent display unit by the user. As will be described later, when a transistor included in the pixel circuit unit PC is formed of a transparent thin film transistor (TFT), such as an oxide semiconductor, and an organic light emitting device is a transparent device, the display unit 2 may further be recognized as a transparent display unit.

If the ratio of the area of the transmitting regions TA with respect to the entire area of the pixel regions PA and the transmitting regions TA is greater than 90%, pixel integrity of the display unit 2 is excessively reduced, and thus, a stable image can hardly be realized through the light emission from the pixel regions PA. That is, as the area of the pixel regions PA is reduced, the amount of light emitted from an organic emission layer 223 of FIG. 7, which will be described later, must be increased in order to realize an image. However, if the organic light emitting device is operated so as to emit light having a high brightness, the lifetime of the organic light emitting device is rapidly reduced. Also, when the ratio of the area of the transmitting regions TA with respect to the entire area of the pixel regions PA and the transmitting regions TA is greater than 90% while the size of a single pixel region PA is maintained at an appropriate size, the number of pixel regions PA is reduced, and accordingly, the resolution of the organic light emitting device is reduced.

The ratio of the area of the transmitting regions TA with respect to the entire area of the pixel regions PA and the transmitting regions TA is, preferably, in a range of 20% to 70%.

When the ratio of the area of the transmitting regions TA with respect to the entire area of the pixel regions PA and the transmitting regions TA is less than 20%, the ratio of the area of the pixel regions PA with respect to the area of the transmitting regions TA is excessively increased. Therefore, the user has a limit in observing an external image through the transmitting regions TA. When the ratio of the area of the transmitting regions TA with respect to the entire area of the pixel regions PA and the transmitting regions TA exceeds 70%, there are a lot of limitations in designing the pixel circuit unit PC.

Figure 5:
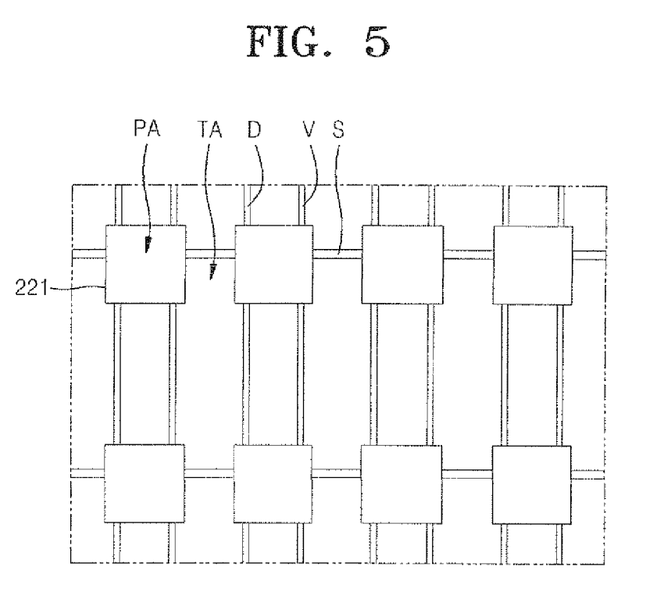
FIG. 5 is a schematic plan view showing the organic light emitting unit of the organic light emitting display device of FIG. 1.

Each of the pixel regions PA includes a pixel electrode 221 which has an area corresponding to the area of pixel regions PA and which is electrically connected to the pixel circuit unit PC. The pixel circuit unit PC overlaps with the pixel electrode 221 so that the pixel circuit unit PC can be covered by the pixel electrode 221. Also, the conductive lines, including the scan line S, the data line D and the driving power line V, are disposed so as to cross the pixel electrode 221. According to an embodiment of the present invention, the pixel electrode 221 has an area equal to or slightly greater than that of the pixel region PA. Accordingly, as shown in FIG. 5, which is a schematic plan view showing the organic light emitting unit of the organic light emitting display device of FIG. 1, when the user observes the organic light emitting unit 21, the pixel circuit unit PC described above is covered by the pixel electrode 221, and a large portion of the conductive lines are also covered. Therefore, since the user sees only a portion of the conductive lines through the transmitting regions TA, the overall transmittance of the transparent organic light emitting display device is improved as described above, and thus, the user can see an external image through the transmitting regions TA.

Figure 6:
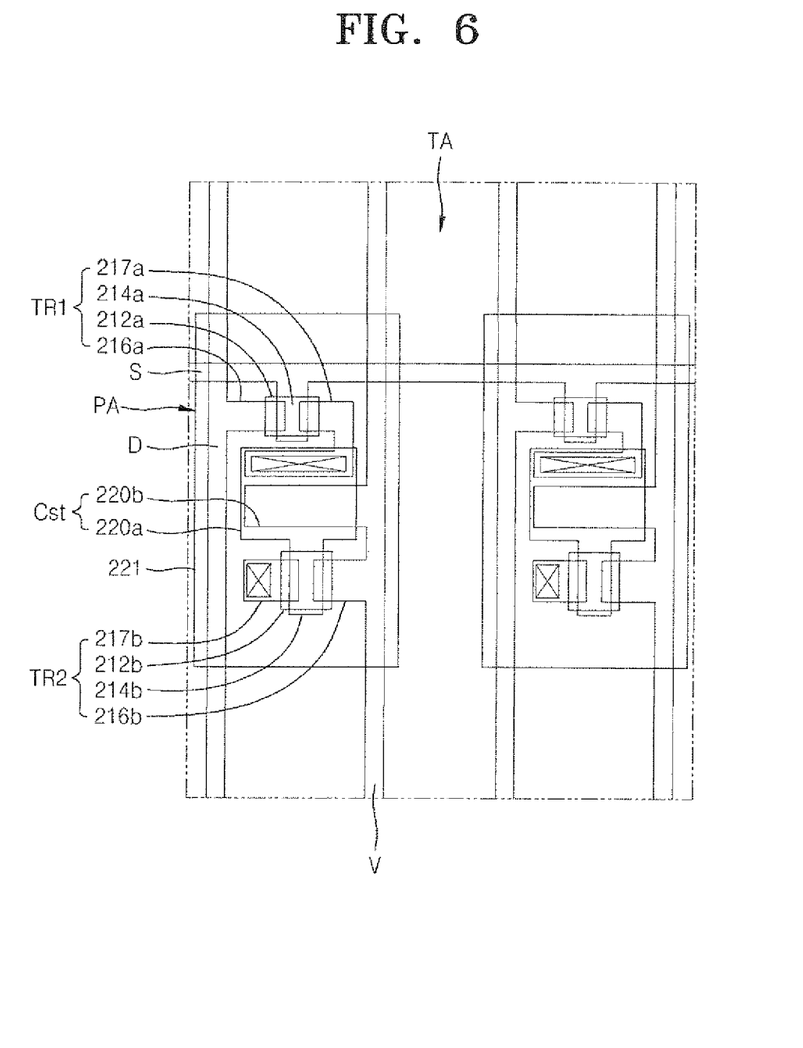
FIG. 6 is a plan view specifically showing details of the organic light emitting unit of FIG. 5.
Figure 7:
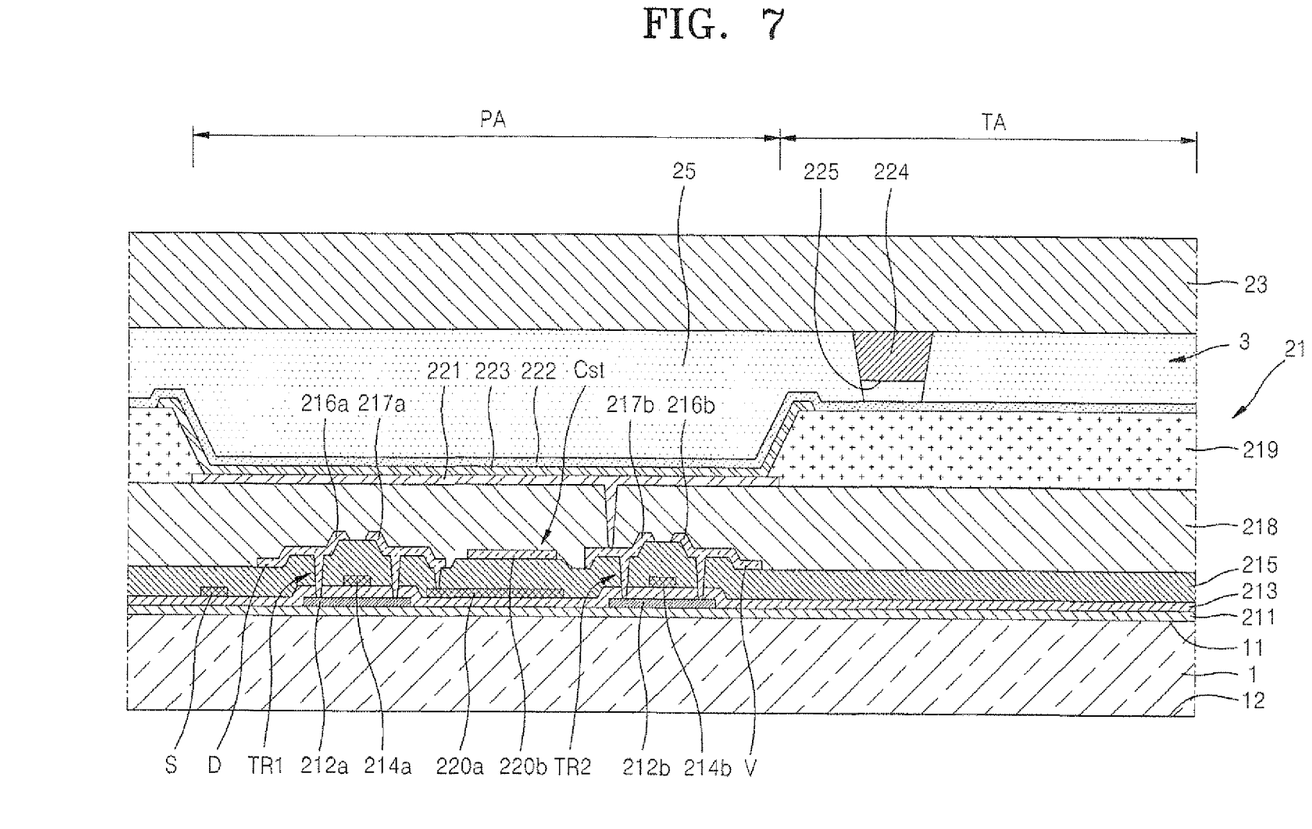
FIG. 7 is an enlarged cross-sectional view of an organic light emitting display device according to another embodiment of the present invention.

FIG. 6 is a plan view specifically showing details of the organic light emitting unit of FIG. 5, while FIG. 7 is an enlarged cross-sectional view of an organic light emitting display device according to another embodiment of the present invention.

The plan view of FIG. 6 and the cross-sectional view of FIG. 7 specifically show an example of the organic light emitting unit 21 of FIG. 5, and the example illustrates the pixel circuit unit PC of FIG. 5 in detail.

Referring to FIGS. 6 and 7, in the organic light emitting unit 21, a buffer layer 211 is formed on the first surface 11 of the substrate 1, and a first thin film transistor (first TFT) TR1, a capacitor Cst, and a second thin film transistor (second TFT) TR2 are formed on the buffer layer 211.

First, a first semiconductor active layer 212a and a second semiconductor active layer 212b are formed on the buffer layer 211.

The buffer layer 211 prevents impurity elements from penetrating into the organic light emitting unit 21, and planarizes a surface of the organic light emitting unit 21. The buffer layer 211 may be formed of any of various materials which can perform the functions described above. For example, the buffer layer 211 may be formed of an inorganic material such as silicon oxide, silicon nitride, silicon oxynitride, aluminum oxide, aluminum nitride, titanium oxide, or titanium nitride, an organic material such as polyimide, polyester, or acryl, or stacks of these materials. The buffer layer 211 is not an essential element, and may not be formed.

The first and second semiconductor active layers 212a and 212b, respectively, may be formed of polycrystal silicon, but are not limited thereto, and may be formed of an oxide semiconductor. For example, the first and second semiconductor active layers 212a and 212b may be G-I-Z-O layers [$(In_2O_3)a(Ga_2O_3)_b(ZnO)_c$ layer] (where a, b, and c are integers that respectively satisfy a≧0, b≧0, and c>0). When the first and second semiconductor active layers 212a and 212b, respectively, are formed of an oxide semiconductor, optical transmittance can further be increased.

A gate insulating layer 213 covering the first and second semiconductor active layers 212a and 212b, respectively, is formed on the buffer layer 211, and first and second gate electrodes 214a and 214b, respectively, are formed on the gate insulating layer 213.

An interlayer insulating layer 215 is formed on the gate insulating layer 213 so as to cover the first and second gate electrodes 214a and 214b, respectively. A first source electrode 216a and a first drain electrode 217a, and a second source electrode 216b and a second drain electrode 217b, are each formed on the interlayer insulating layer 215, and are respectively connected to the first semiconductor active layer 212a and the second semiconductor active layer 212b through contact holes.

Further referring to FIG. 7, the scan line S may be simultaneously formed with the first and second gate electrodes 214a and 214b, respectively. The data line D may be simultaneously formed with the first source electrode 216a and connected to the first source electrode 216a. The driving power line V may be simultaneously formed with the second source electrode 216b and connected to the second source electrode 216b.

In the capacitor Cst, a lower electrode 220a is simultaneously formed with the first and second gate electrodes 214a and 214b, respectively, and an upper electrode 220b is simultaneously formed with the first drain electrode 217a.

The structures of the first TFT TR1, the capacitor Cst and the second TFT TR2 are not limited thereto, and any of various types of TFT and capacitor structures can be employed.

A passivation layer 218 is formed so as to cover the first TFT TR1, the capacitor Cst and the second TFT TR2. The passivation layer 218 may be a single layer or multiple layers of insulating material, an upper surface of which is planarized, and may be formed of an inorganic material and/or an organic material.

A pixel electrode 221 covering the first TFT TR1, the capacitor Cst and the second TFT TR2 may be formed on the passivation layer 218, as shown in FIGS. 6 and 7. The pixel electrode 221 is connected to the second drain electrode 217b of the second TFT TR2 through a via hole formed in the passivation layer 218. As shown in FIG. 6, the pixel electrode 221 is formed in each pixel as an island independent from other electrodes.

A pixel defining layer 219 covering edges of the pixel electrode 221 is formed on the passivation layer 218. An organic emission layer 223 and an opposite electrode 222 are sequentially formed on the pixel electrode 221. The opposite electrode 222 is formed on all of the pixel regions PA and the transmitting regions TA.

The organic emission layer 223 may be a low molecular weight organic layer or a polymer organic layer. When the organic emission layer 223 is a low molecular weight organic layer, the organic emission layer 223 may be formed by stacking a hole injection layer (HIL), a hole transport layer (HTL), an emission layer (EML), an electron transport layer (ETL), and an electron injection layer (EIL) in a single structure or a composite structure, and may be formed of any of various materials such as copper phthalocyanine (CuPc), N,N'-Di(naphthalene-1-yl)-N,N'-diphenyl-benzidine (NPB), or tris-8-hydroxyquinoline aluminum (Alq3). The low molecular weight organic layer may be formed by vacuum deposition. The HIL, the HTL, the ETL, and the EIL are common layers, and may be commonly applied to red, green and blue pixels. Accordingly, unlike the organic emission layer 223 in FIG. 7, the common layers may be formed so as to cover the pixel regions PA and the transmitting regions TA like the opposite electrode 222.

The pixel electrode 221 functions as an anode electrode, and the opposite electrode 222 functions as a cathode electrode. Of course, the polarities of the pixel electrode 221 and the opposite electrode 222 may be reversed.

The pixel electrode 221 is formed so as to have a size corresponding to the pixel region PA in each pixel. If a region covered by the pixel defining layer 219 is excluded from the pixel electrode 221, the pixel electrode 221 has an area identical to that of one of the pixel regions PA. The opposite electrode 222 is formed as a common electrode so as to cover all of the pixels of the organic light emitting unit 21.

According to an embodiment of the present invention, the pixel electrode 221 may be a reflection electrode and the opposite electrode 222 may be a transparent electrode. Thus, the organic light emitting unit 21 is a top emission type in which an image is displayed in a direction toward the opposite electrode 222.

To this end, the pixel electrode 221 may include a reflection film formed of silver (Ag), magnesium (Mg), aluminum (Al), platinum (Pt), palladium (Pd), gold (Au), nickel (Ni), neodymium (Nd), iridium (Ir), chromium (Cr), lithium (Li), calcium (Ca), or a compound of these materials, or an oxide having a high work function, such as ITO, IZO, ZnO, or $In_2O_3$. The opposite electrode 222 may be formed of a metal having a low work function, such as Ag, Mg, Al, Pt, Pd, Au, Ni, Nd, Ir, Cr, Li, or Ca, or an alloy thereof. The opposite electrode 222 may be formed as a thin film so as to increase transmittance.

When the pixel electrode 221 is a reflection electrode, a pixel circuit unit disposed under the pixel electrode 221 is covered by the pixel electrode 221. Therefore, referring to FIG. 7, at upper outer sides of the opposite electrode 222, the user cannot observe the first TFT TR1, the capacitor Cst, and the second TFT TR2 disposed under the pixel electrode 221, as well as portions of the scan line S, the data line D, and the driving power line V.

As the pixel electrode 221 is the reflection electrode, light is emitted only toward the user. Thus, the amount of light to be lost in a direction opposite to a direction of the user can be reduced. Also, since the pixel electrode 221 covers various patterns of the pixel circuit unit disposed under the pixel electrode 221 as described above, the user can see a clearer external image.

The present invention is not limited thereto and, for example, the pixel electrode 221 can also be a transparent electrode. It is sufficient that the pixel electrode 221 be formed of an oxide having a high work function, such as ITO, IZO, ZnO, or $In_2O_3$, without including the above-described reflection film. If the pixel electrode 221 is transparent, at the upper outer sides of the opposite electrode 222, the user can observe the first TFT TR1, the capacitor Cst, and the second TFT TR2 disposed under the pixel electrode 221, as well as portions of the scan line S, the data line D, and the driving power line V. Although the pixel electrode 221 is transparent, there is a loss of light since the transmittance of light therethrough cannot be 100%, and the transmittance of external light is further reduced due to the pixel electrode 221 since the conductive patterns are disposed in the region of the pixel electrode 221. Therefore, interference due to the conductive patterns on the external light is reduced as compared to the situation where the external light directly enters the conductive patterns, thereby reducing distortion of an external image.

The passivation layer 218, the gate insulating layer 213, the interlayer insulating layer 215, and the pixel defining layer 219 may be formed as transparent insulating layers. The substrate 1 may have a transmittance smaller or equal to the total transmittance of the transparent insulating layers.

The passivation layer 218 corresponds to a first insulating layer recited in the appended claims, and the gate insulating layer 213, the interlayer insulating layer 215, and the pixel defining layer 219 correspond to a plurality of second insulating layers recited in the appended claims.

As described above, since the opposite electrode 222 is formed of metal in the shape of a thin film so as to increase transmittance, and is formed as a common electrode so as to cover all of the pixels of the organic light emitting unit 21, the sheet resistance is increased, and a voltage drop easily occurs.

In the present invention, in order to solve these problems, the organic light emitting display device of FIG. 7 further includes the conduction unit 224 which is interposed between the second substrate 23 and the opposite electrode 222, and which has both ends contacting the first substrate 23 and the opposite electrode 222, respectively.

The conduction unit 224 is interposed between the second substrate 23 and the opposite electrode 222. The conduction unit 224 may be formed on a surface of the second substrate 23 in a direction toward the opposite electrode 222 so as to contact the opposite electrode 222 as the second substrate 23 is bonded to the first substrate 1.

The conduction unit 224 may be formed of metal having high electrical conductivity. As shown in FIG. 7, the conduction unit 224 may be disposed so as to correspond to the transmitting regions TA.

Figure 8A:
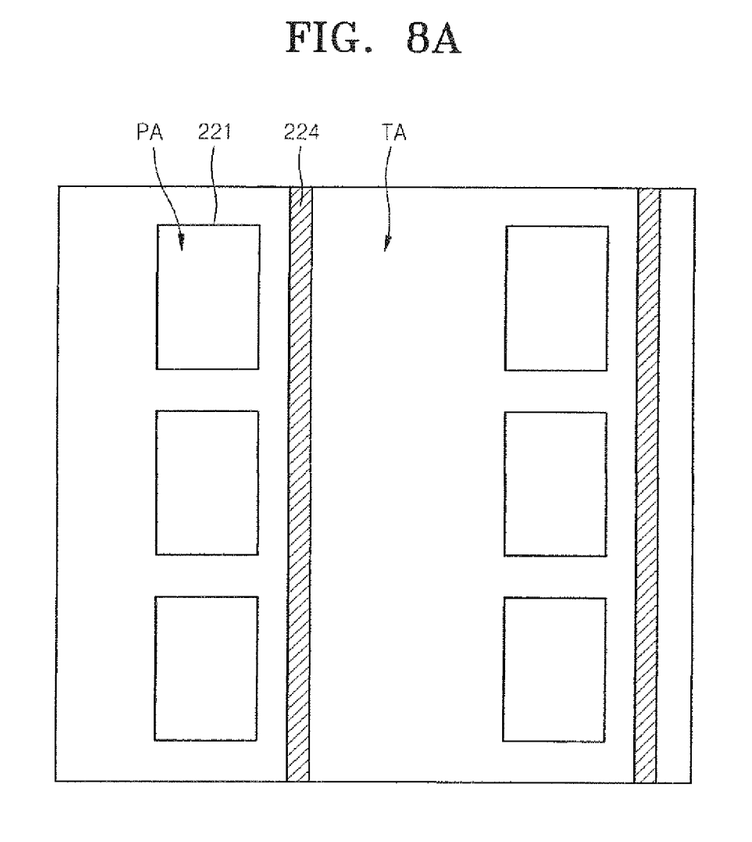
FIGS. 8A thru 8C are plan views showing examples of a conduction unit of FIG. 7.
Figure 8B:
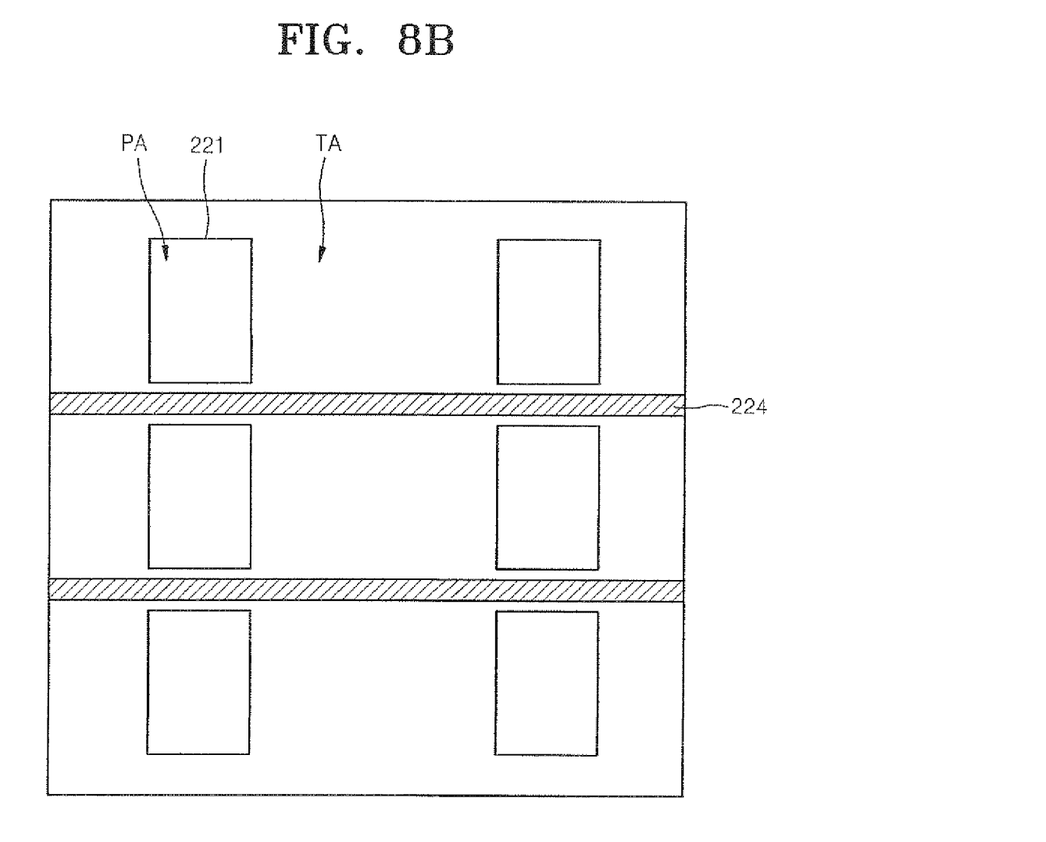
Figure 8C:
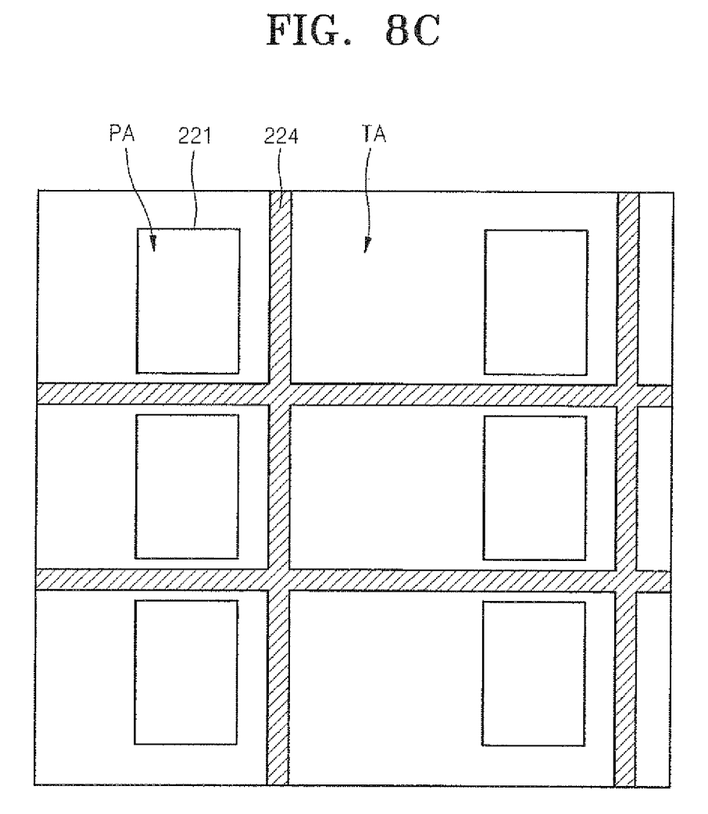

FIGS. 8A thru 8C are plan views showing examples of a conduction unit of FIG. 7.

The conduction unit 224 may be formed in a straight line parallel to the data line D, as shown in FIG. 8A, or in a straight line parallel to the scan line S, as shown in FIG. 8B. In addition, as shown in FIG. 8C, the conduction unit 224 may be formed by combination of straight lines parallel to the data line D and the scan line S respectively.

Referring to FIG. 7, the space between the second substrate 23 and the opposite electrode 222 may be filled with a filler 3.

The filler 3 may have a buffering effect on the space 25 between the second substrate 23 and the opposite electrode 222 and may also have an absorption function by further including an absorbent.

The filler 3 is formed in such a way that a liquid material having viscosity is dropped on a top surface of the second substrate 23 or the opposite electrode 222, the first substrate 1 and the second substrate 23 are bonded to each other, and the liquid material flows into the space 25, is spread thereinto, and is filled therein. After filling is completed, the filler 3 is cured by ultraviolet (UV) rays or the like.

As described above, however, when the conduction unit 224 is interposed between the second substrate 23 and the opposite electrode 222, and both ends of the conduction unit 224 contact the second substrate 23 and the opposite electrode 222, respectively, when the material for forming the filler 3 flows into the space 25, it may not sufficiently flow into the space 25 due to the conduction unit 224.

Figure 9A:
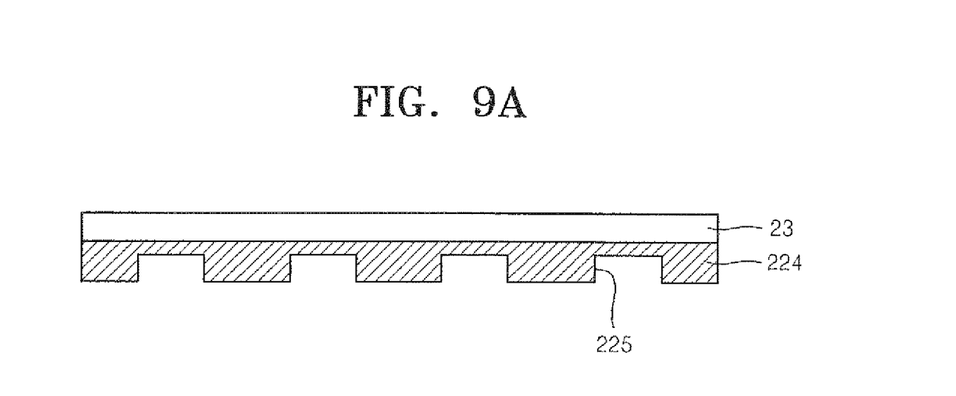
FIGS. 9A thru 9C are cross-sectional views of another example of the conduction unit of FIG. 7.
Figure 9B:
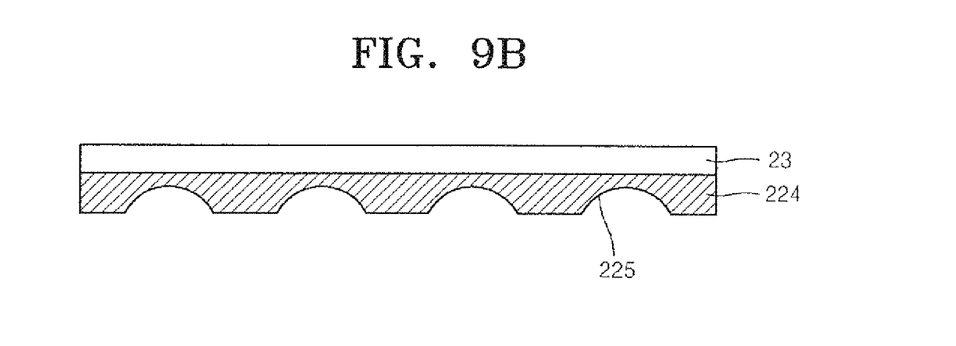
Figure 9C:
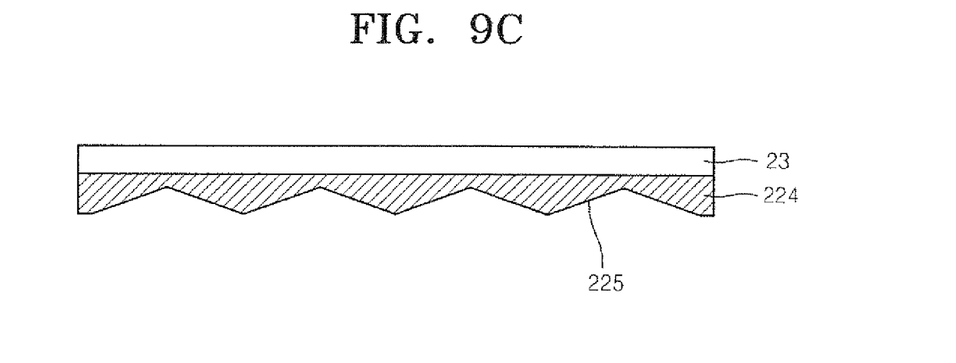

To solve this problem, according to another embodiment of the present invention, an inlet portion 225 may be formed on the conduction unit 224, as shown in FIGS. 9A through 9C, which are cross-sectional views of another example of the conduction unit of FIG. 7.

The inlet portion 225 does not contact the opposite electrode 222 (FIG. 7). Thus, the filler 3 is interposed between the inlet portion 225 and the opposite electrode 222. In detail, the inlet portion 225 is a flow path of the material for forming the filler 3.

Thus, even when the conduction unit 224 is present, the filler 3 may be sufficiently filled in the space 25.

As described above, according to the present invention, a transparent organic light emitting display device, in which transmittance of external light is increased and, simultaneously, a sheet resistance of an opposite electrode is reduced so as to reduce voltage drop in the opposite electrode, is obtained.

Furthermore, a transparent organic light emitting display device which can prevent distortion of an image transmitted therethrough by preventing light transmitting therethrough from scattering is obtained.

While the present invention has been particularly shown and described with reference to exemplary embodiments thereof, it will be understood by those of ordinary skill in the art that various changes in form and detail may be made therein without departing from the spirit and scope of the present invention as defined by the following claims.

What is claimed is:

1. An organic light emitting display device, comprising:
   a first substrate having a transmitting region and a plurality of pixel regions separated from each other by the transmitting region which is interposed between the pixel regions, each of the pixel regions comprising:

a plurality of thin film transistors positioned on a first surface of the first substrate;

a passivation layer covering the plurality of thin film transistors;

a pixel electrode formed on the passivation layer so as to be electrically connected to the thin film transistors, and being disposed so as to overlap and cover the thin film transistors;

an opposite electrode facing the pixel electrode, and formed so as to be able to transmit light, the opposite electrode extending into the transmitting region; and an organic emission layer interposed between the pixel electrode and the opposite electrode so as to emit light;

a second substrate disposed so as to face the opposite electrode and bonded to the first substrate; and a conduction unit interposed between the second substrate and the opposite electrode, said conduction unit contacting the second substrate and the opposite electrode, respectively, and being formed of a conductive material.

2. The organic light emitting display device of claim 1, wherein the pixel electrode has an area identical to an area of the pixel region.

3. The organic light emitting display device of claim 1, further comprising a plurality of conductive lines extending through the transmitting region and the plurality of pixel regions, the conductive lines being electrically connected to the thin film transistors and arranged so as to be overlapped by the pixel electrode.

4. The organic light emitting display device of claim 1, wherein a ratio of an area of the transmitting region with respect to a total area of the pixel regions and the transmitting region is in a range of 5% to 90%.

5. The organic light emitting display device of claim 1, wherein the passivation layer is formed on both the transmitting region and the pixel regions, and is formed of a transparent material.

6. The organic light emitting display device of claim 1, wherein the conduction unit is disposed in the transmitting region.

7. The organic light emitting display device of claim 1, further comprising:
a sealant for sealing edges of the first and second substrates; and
a filler interposed between the first and second substrates which are sealed by the sealant.

8. The organic light emitting display device of claim 7, wherein the conduction unit comprises an inlet portion, the inlet portion does not contact the opposite electrode, and the filler is interposed between the inlet portion and the opposite electrode.

9. The organic light emitting display device of claim 1, wherein the conduction unit is formed on a surface of the second substrate in a direction toward the opposite electrode.

10. The organic light emitting display device of claim 1, wherein the pixel electrode is a reflection electrode.

11. An organic light emitting display device, comprising:
a first substrate having a transmitting region and a plurality of pixel regions separated from each other by the transmitting region which is interposed between the pixel regions, each of the pixel regions comprising:
a pixel circuit unit formed on a first surface of the first substrate, the pixel circuit unit comprising at least one thin film transistor;
a first insulating layer covering the pixel circuit unit;
a pixel formed on the first insulating layer so as to be electrically connected to the pixel circuit unit, and disposed so as to overlap and cover the pixel circuit unit;
an opposite electrode facing the pixel electrode, and formed so as to be able to transmit light, the opposite electrode extending into the transmitting region; and
an organic emission layer interposed between the pixel electrode and the opposite electrode so as to emit light;
a second substrate disposed to face the opposite electrode and bonded to the first substrate; and
a conduction unit interposed between the second substrate and the opposite electrode, said conduction unit contacting the second substrate and the opposite electrode, respectively, and being formed of a conductive material.

12. The organic light emitting display device of claim 11, wherein the pixel electrode has an area identical to an area of the pixel region.

13. The organic light emitting display device of claim 11, further comprising a plurality of conductive lines electrically connected to the pixel circuit unit, wherein all of the conductive lines are arranged so as to cross the transmitting region and the pixel regions.

14. The organic light emitting display device of claim 11, wherein a ratio of an area of the transmitting region with respect to a total area of the pixel regions and the transmitting region is in a range of 5% to 90%.

15. The organic light emitting display device of claim 11, wherein the first insulating layer and a plurality of second insulating layers are formed on both the transmitting region and the pixel regions, and are formed of a transparent material.

16. The organic light emitting display device of claim 11, wherein the conduction unit is disposed in the transmitting region.

17. The organic light emitting display device of claim 11, further comprising:
a sealant for sealing edges of the first and second substrates; and
a filler interposed between the first and second substrates which are sealed by the sealant.

18. The organic light emitting display device of claim 17, wherein the conduction unit comprises an inlet portion, the inlet portion does not contact the opposite electrode, and the filler is interposed between the inlet portion and the opposite electrode.

19. The organic light emitting display device of claim 11, wherein the conduction unit is formed on a surface of the second substrate toward a direction to the opposite electrode.

20. The organic light emitting display device of claim 11, wherein the pixel electrode is a reflection electrode.

* * * * *